(12) United States Patent
Jung

(10) Patent No.: US 7,023,197 B2
(45) Date of Patent: Apr. 4, 2006

(54) SEMICONDUCTOR DEVICE LOADING APPARATUS FOR TEST HANDLERS

(75) Inventor: Byung-Gi Jung, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 535 days.

(21) Appl. No.: 09/977,199

(22) Filed: Oct. 16, 2001

(65) Prior Publication Data

US 2003/0034280 A1    Feb. 20, 2003

(30) Foreign Application Priority Data

Aug. 1, 2001    (KR)    ................ 2001-46454

(51) Int. Cl.
*G01R 31/28* (2006.01)

(52) U.S. Cl. ................................. 324/158.1

(58) Field of Classification Search ............ 324/158.1, 324/754, 760, 765; 414/403–404, 416.01; 298/641, 65, 87.1; 294/641, 65, 87.1
See application file for complete search history.

(56) References Cited

U.S. PATENT DOCUMENTS

| | | | | |
|---|---|---|---|---|
| 3,610,673 A | * | 10/1971 | Strombeck et al. ........... | 294/65 |
| 3,860,280 A | * | 1/1975 | Karlsson .................... | 294/87.1 |
| 5,184,068 A | * | 2/1993 | Twigg et al. ................ | 324/755 |
| 5,290,134 A | * | 3/1994 | Baba ........................... | 414/404 |
| 5,772,387 A | * | 6/1998 | Nakamura et al. .......... | 414/404 |
| 5,839,769 A | * | 11/1998 | Slocum et al. .............. | 294/87.1 |
| 5,894,217 A | | 4/1999 | Igarashi et al. ........... | 324/158.1 |
| 5,920,192 A | * | 7/1999 | Kiyokawa ................. | 324/158.1 |
| 5,961,168 A | * | 10/1999 | Kanno ........................ | 294/64.1 |
| 6,068,317 A | * | 5/2000 | Park .......................... | 294/87.1 |
| 6,163,145 A | * | 12/2000 | Yamada et al. ........... | 324/158.1 |
| 6,184,047 B1 | * | 2/2001 | Shekar et al. .............. | 294/64.1 |
| 6,184,675 B1 | * | 2/2001 | Bannai ..................... | 324/158.1 |
| 6,259,247 B1 | * | 7/2001 | Bannai ..................... | 324/158.1 |
| 6,439,631 B1 | * | 8/2002 | Kress .......................... | 294/65 |
| 6,593,761 B1 | * | 7/2003 | Fukasawa et al. .......... | 324/754 |

FOREIGN PATENT DOCUMENTS

| | | |
|---|---|---|
| JP | 9-113580 | 5/1997 |
| JP | 11-174119 | 7/1999 |

* cited by examiner

*Primary Examiner*—Jermele Hollington
(74) *Attorney, Agent, or Firm*—Staas & Halsey LLP

(57) ABSTRACT

Disclosed herein is a semiconductor device loading apparatus for test handlers. The semiconductor device loading apparatus includes a body. The apparatus body includes a plurality of pickup cylinders provided with a plurality of vacuum adsorbers for vacuum-sucking and transferring semiconductor devices to be tested, a space adjusting plate for adjusting the pitches of the vacuum adsorbers, and an elevation guiding means for guiding the lifting and lowering of the space adjusting plate. A guide block fixing plate is formed to be separate from the body for guiding the semiconductor devices to be accurately positioned in the pockets of a test tray, respectively.

23 Claims, 9 Drawing Sheets

SEMICONDUCTOR DEVICE LOADING APPARATUS FOR TEST HANDLERS

BACKGROUND OF THE INVENTION

1. Field of the Invention

The present invention relates generally to test handlers for testing semiconductor devices, and more particularly to a semiconductor device loading apparatus for test handlers that is used to precisely transfer semiconductor devices loaded in a presizing unit to the test pockets of a test tray, respectively.

2. Description of the Prior Art

In general, test handlers for semiconductor devices are apparatuses for testing semiconductor devices (hereinafter, referred to as devices) fabricated through a predetermined fabrication procedure, classifying the devices into a plurality of types according to their grades of quality and stacking them according to their grades of quality.

The tester handler functioning as described above is provided with a semiconductor loading apparatus for vacuum-sucking a plurality of devices from a presizing unit and loading the devices in a test tray. The applicant of the present application filed a patent application (Korean Pat. Appln. No. 10-1997-0012445) entitled "a test handler for semiconductor devices with a semiconductor device loading apparatus" and this patent application was issued as Korean Pat. No. 10-0243049.

FIGS. 1 and 2 illustrate a conventional semiconductor device loading apparatus (hereinafter, referred to as "device loading apparatus") disclosed in Korean Pat. No 10-0243049. As shown in the drawings, the conventional device loading apparatus 100 is constructed to be moved along X and Y-axes by a guider 103, which is movable along a guide rail 102 attached to an X-axis support 101, and a connecting member 106.

The connecting member 106 is provided on its lower portion with a frame member 104 and an elevation cylinder 107 for moving the frame member 104.

The frame member 104 is provided on its lower portion with a pin-fixing plate 130 having a plurality of guide pins 131, which can be inserted into a plurality of pin holes 110d (see FIG. 3) so that pickup cylinders 112 and vacuum adsorbers 111 are located at positions over the corresponding pockets 110a of the test tray 110.

The tops of the pickup cylinders 112 are connected to a zigzag extension member 121 that is operated by an expandable cylinder 122.

FIG. 3 is a plan view showing the construction of the test tray 110 that is loaded with the devices 109 vacuum-sucked by the conventional device loading apparatus 100. As illustrated in this drawing, the test tray 110 is comprised of a plurality of pockets 110a formed to allow the devices 109 to be laid down therein and a frame 110b formed to allow the pockets 110a to be attached thereto in a plurality of rows and columns. The pockets 110a are loosely attached to the surface of the frame 110b to be slightly movable laterally. A plurality of pin holes 110d are formed on the front and rear edges of each pocket 110a to receive the corresponding guide pins 110d of the device loading apparatus 100 so as to guide each device 109 to the pocket 110a when the devices 109 are loaded in the pockets 110a. A device seat 110c formed on the bottom of each pocket 110a has the same size as each device 109.

The device loading apparatus 100 carries out the operation of accurately positioning the devices to be tested in the pockets 110a of the test tray 110. The operation of the device loading apparatus 100 is described in detail with reference to FIG. 4.

First of all, the device loading apparatus 100 is moved to a position over the test tray 110 with the devices 109 being vacuum-sucked by the vacuum adsorbers 111 of the device loading apparatus 100. Thereafter, the device loading apparatus 100 is lowered to approach the test tray 110, and a plurality of guide pins 131 arranged on the bottom of the device loading apparatus 100 are inserted into the pin holes 110d formed in the pockets 110a of the test tray 110. In such a case, when sucking force is removed from the vacuum adsorbers 111 by the pickup cylinder 112, the device 109 is separated from the vacuum adsorbers 111 and positioned in the pocket 110a of the test tray 110.

As described above, the conventional device loading apparatus has a complicated structure and a heavy weight and carries out its operations while being moved vertically and horizontally, so it is difficult to rapidly move the conventional device loading apparatus to an exact position.

In summary, in the conventional device loading apparatus, there are provided the guider 103 movable along an X-axis, the connecting member 106 connected to the guider 103 and the frame member 104 connected to the connecting member 106. In addition, the frame member 104 is provided with the elevation cylinder 107 for moving the device loading apparatus along an Y-axis, a plurality of pickup cylinders 112 provided with a plurality of vacuum adsorbers 111 to load the devices 109 in the test tray 110, the extension member 121 comprised of a plurality of links to adjust the spaces between the pickup cylinders 112 and the guide pin-fixing plate 130 with a plurality of guide pins 131 to accurately position the devices 109 in the pockets 110a of the test tray 110, so the weight of the device loading apparatus 100 is excessive heavy. It is very difficult for the heavy device loading apparatus 100 to rapidly and accurately carry out the operations of picking up the devices 109 and loading them in the pockets 110a of the test tray 110.

Additionally, the conventional device loading apparatus 100 may not accurately position the devices 109 adhered to the vacuum adsorbers 111 in the pockets 110a of the test tray 110 by the guide pins 131.

That is, in the conventional device loading apparatus 100, though the devices 109 adhered to the vacuum adsorbers 111 are loaded in the pockets 110a of the test tray 110 after the guide pins 131 attached to the guide pin-fixing plate 130 are inserted into the pin holes 110d formed in the test tray 110, the devices 109 are not accurately positioned in the pockets 110a but are offset because the falling of the devices 109 to the pockets 110a is carried out without any guidance.

The devices inaccurately positioned in the pockets 110a hinder accurate testing by a test handler, and increase their defective rate.

SUMMARY OF THE INVENTION

Accordingly, the present invention has been made keeping in mind the above problems occurring in the prior art, and an object of the present invention is to provide a device loading apparatus for test handlers, in which a pin-fixing plate with a plurality of guide pins designed to be separate from an apparatus body movable vertically and horizontally, thereby reducing the weight of the apparatus body.

Another object of the present invention is to provide a device loading apparatus for test handlers, in which the structure of guide blocks with guide pins is improved, thereby guiding devices to be accurately positioned in the pockets of the test tray, respectively.

In order to accomplish the above object, the present invention provides a semiconductor device loading apparatus for test handlers, comprising: a body including a plurality of pickup cylinders provided with a plurality of vacuum adsorbers for vacuum-sucking and transferring semiconductor devices to be tested, a space adjusting plate for adjusting the pitches of the vacuum adsorbers, and an elevation guiding means for guiding the lifting and lowering of the space adjusting plate; and a guide block fixing plate formed to be separate from the body for guiding the semiconductor devices to be accurately positioned in pockets of a test tray, respectively.

Preferably, the space adjusting plate may be provided with a plurality of guide slots formed to allow spaces therebetween to be downwardly narrowed so as to adjust pitches of the vacuum adsorbers, and the vacuum adsorbers are each provided with a guide projection adapted to be inserted to one of the guide slots.

Preferably, the guide block fixing plate may be positioned to be downwardly spaced apart from the vacuum adsorbers and upwardly spaced apart from the test tray, and is provided with guide blocks of the number equal to the number of the pockets of the test tray.

Preferably, the guide blocks may be each provided with an opening sized to be equal to the size of each of the semiconductor devices, and with a pair of guide pins downwardly extended from front and rear edges thereof.

Preferably, the guide pins each may have a diameter smaller than the diameter of each of the pin holes formed in front and rear edges of the pocket, and are spaced apart from each other by a space equal to the space between the pair of pin holes.

Preferably, the openings may each comprise an entrance portion formed on the upper surface of the guide block and sized to be slightly larger than the size of each of the semiconductor devices to easily receive the semiconductor device, an exit portion formed on the lower surface of the guide block and sized to be substantially equal to the size of the semiconductor device to allow the semiconductor device to pass therethrough, and a guide portion formed between the entrance and exit portions and tapered from the entrance portion to the exit portion.

BRIEF DESCRIPTION OF THE DRAWINGS

The above and other objects, features and other advantages of the present invention will be more clearly understood from the following detailed description taken in conjunction with the accompanying drawings, in which:

FIGS. 8A and 8B are partial cross sections showing the operation of the device loading apparatus of the present invention, wherein FIG. 8A is a view showing the operation in which a pickup cylinder and the test tray are being moved toward a guide block fixing plate to load the device in the test tray, and FIG. 8B is a view showing the operation in which the device adhered to the pickup cylinder is transferred to the test tray after the test tray and the guide block fixing plate are joined together.

DESCRIPTION OF THE PREFERRED EMBODIMENTS

Hereinafter, a device loading apparatus for test handlers in accordance with a preferred embodiment of the present invention is described with reference to the accompanying drawings.

A test handler including the device loading apparatus of the present invention is comprised of a presizing unit, a pitch fixing hand, a test tray, preheating and recovery chambers and a device unloading unit, and functions to test fabricated semiconductor devices. The device loading apparatus of the present invention serves to pick up the devices supplied to the presizing unit, to load the devices in the test tray, and to remove tested devices from the test tray to the device unloading unit.

The construction and operation of the device loading apparatus of the present invention are described in detail with reference to FIGS. 5 to 8.

Figure 5:
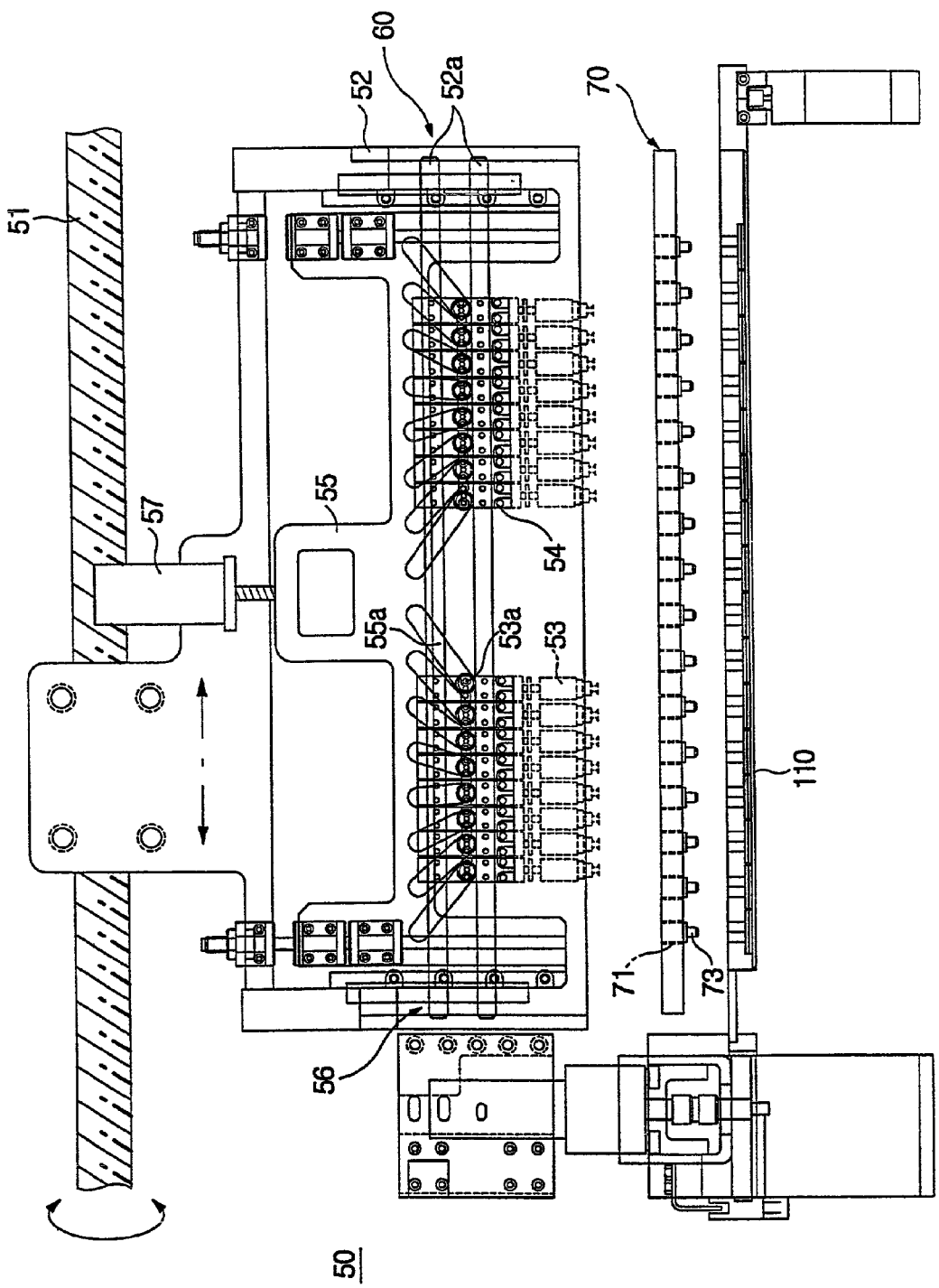
FIG. 5 is a front view showing a device loading apparatus in accordance with the present invention.
Figure 6:
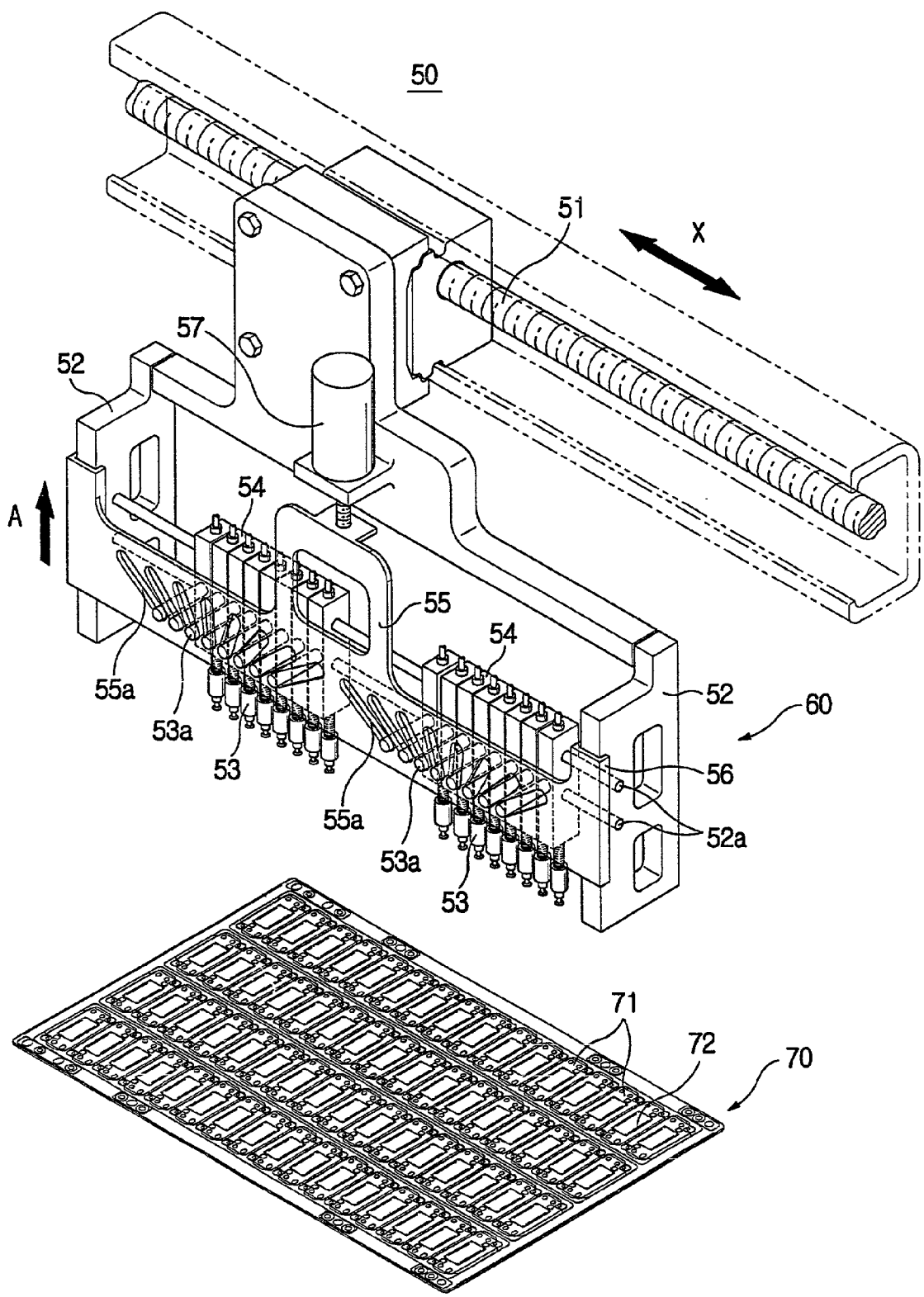
FIG. 6 is a perspective view showing the operation in which the spaces between pickup cylinders are narrowed to coincide with the spaces between the pockets of a test tray by the lifting of the space adjusting plate of the device loading apparatus.
Figure 7:
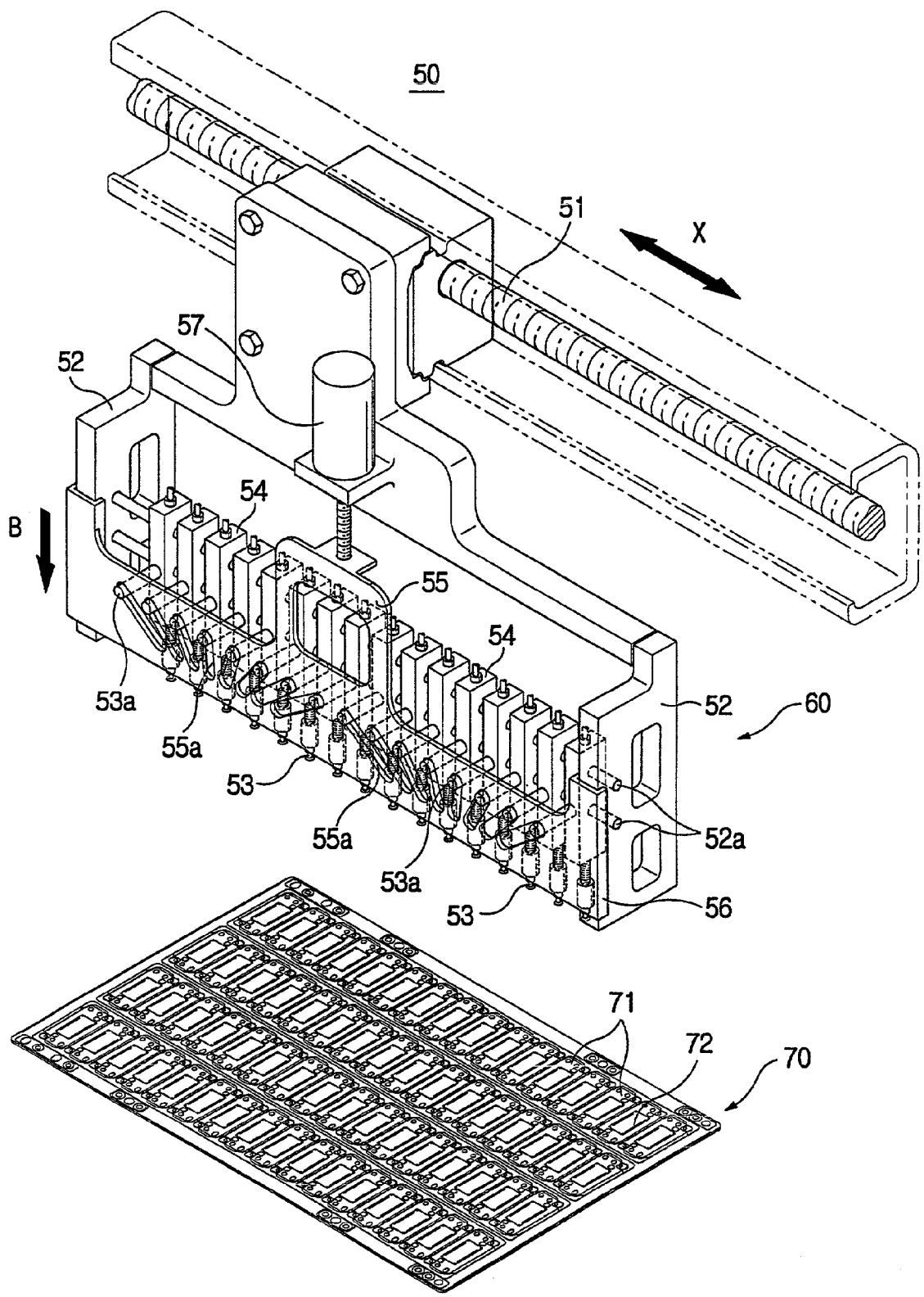
FIG. 7 is a perspective view showing the operation in which the spaces between pickup cylinders are widened to coincide with the spaces between the pockets of a test tray by the lowering of the space adjusting plate of the device loading apparatus.

FIG. 5 is a plan view showing the device loading apparatus of the present invention. FIGS. 6 and 7 are perspective views showing the lifting and lowering of the space adjusting plate of the device loading apparatus of FIG. 5, respectively.

Figure 1:
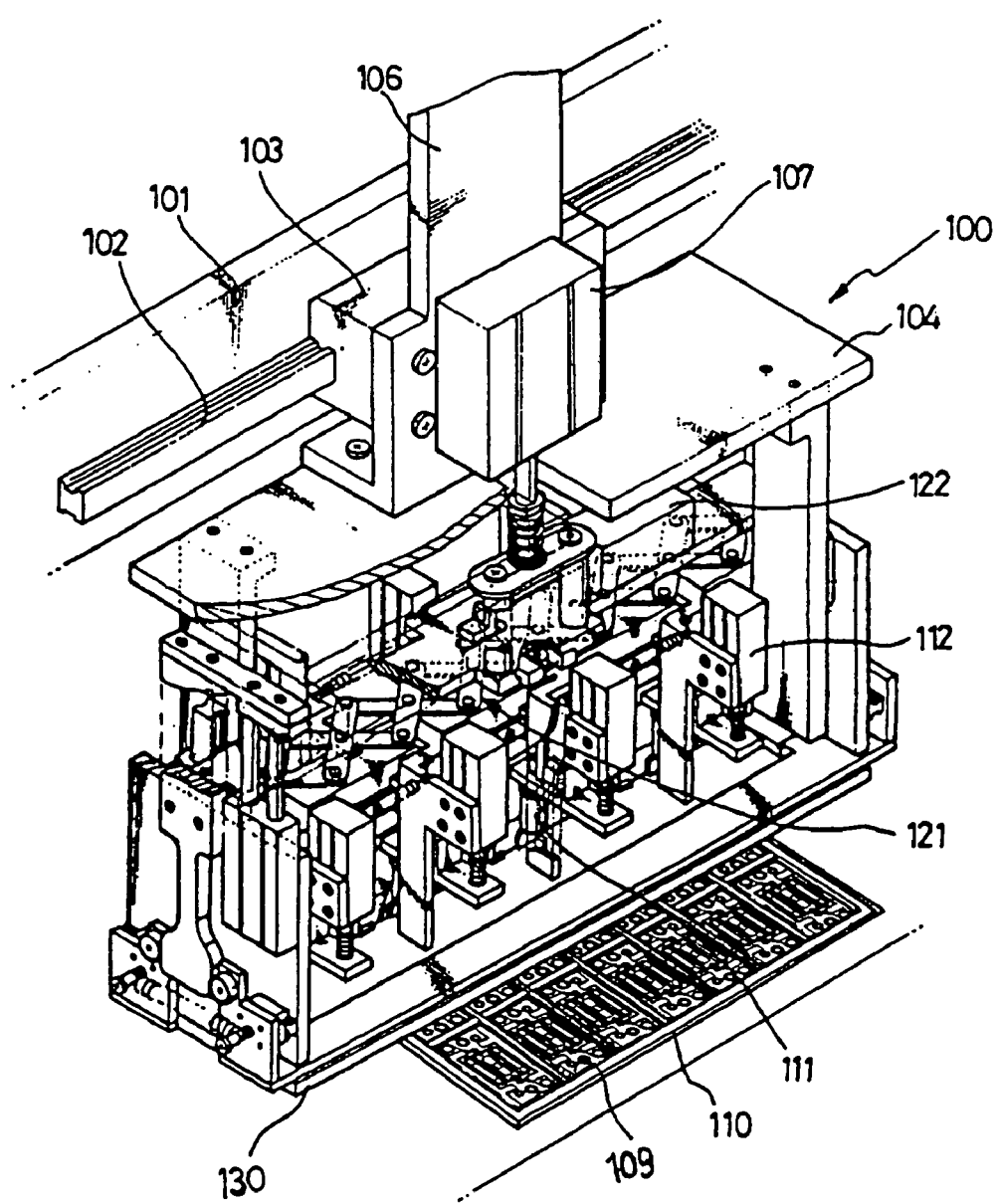
FIG. 1 is a perspective view showing a conventional device loading apparatus for test handlers.
Figure 2:
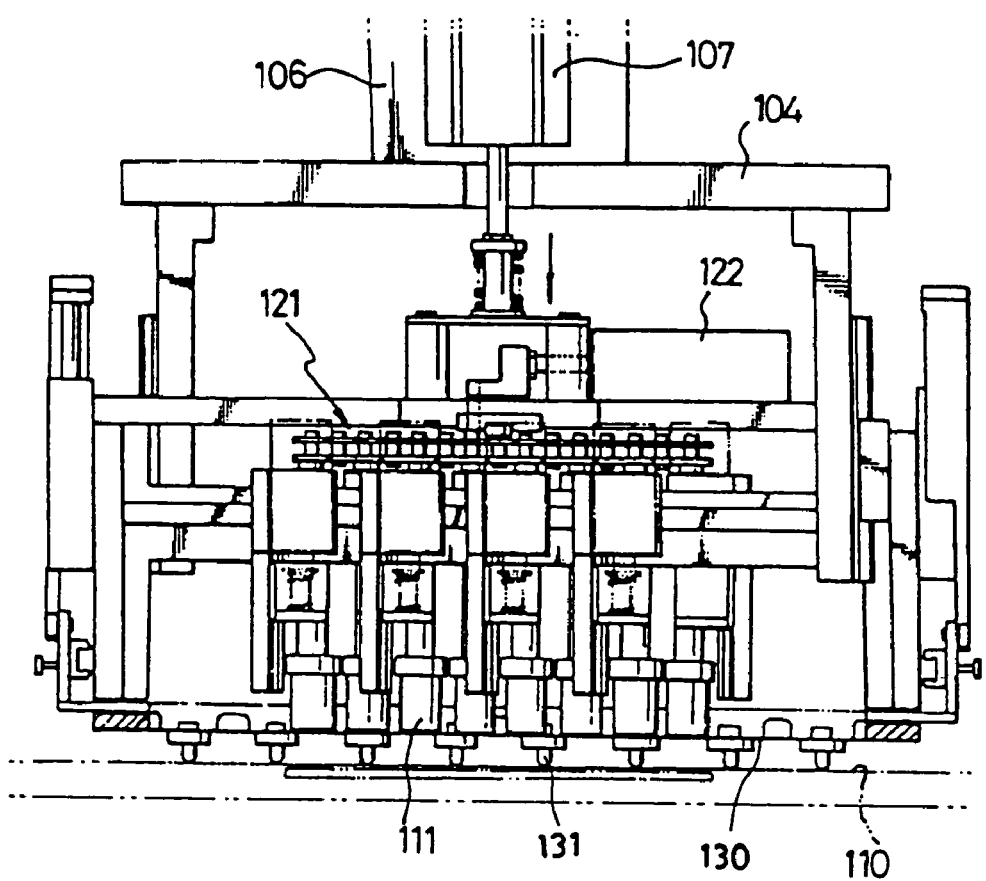
FIG. 2 is a plan view showing the conventional device loading apparatus of FIG.
Figure 3:
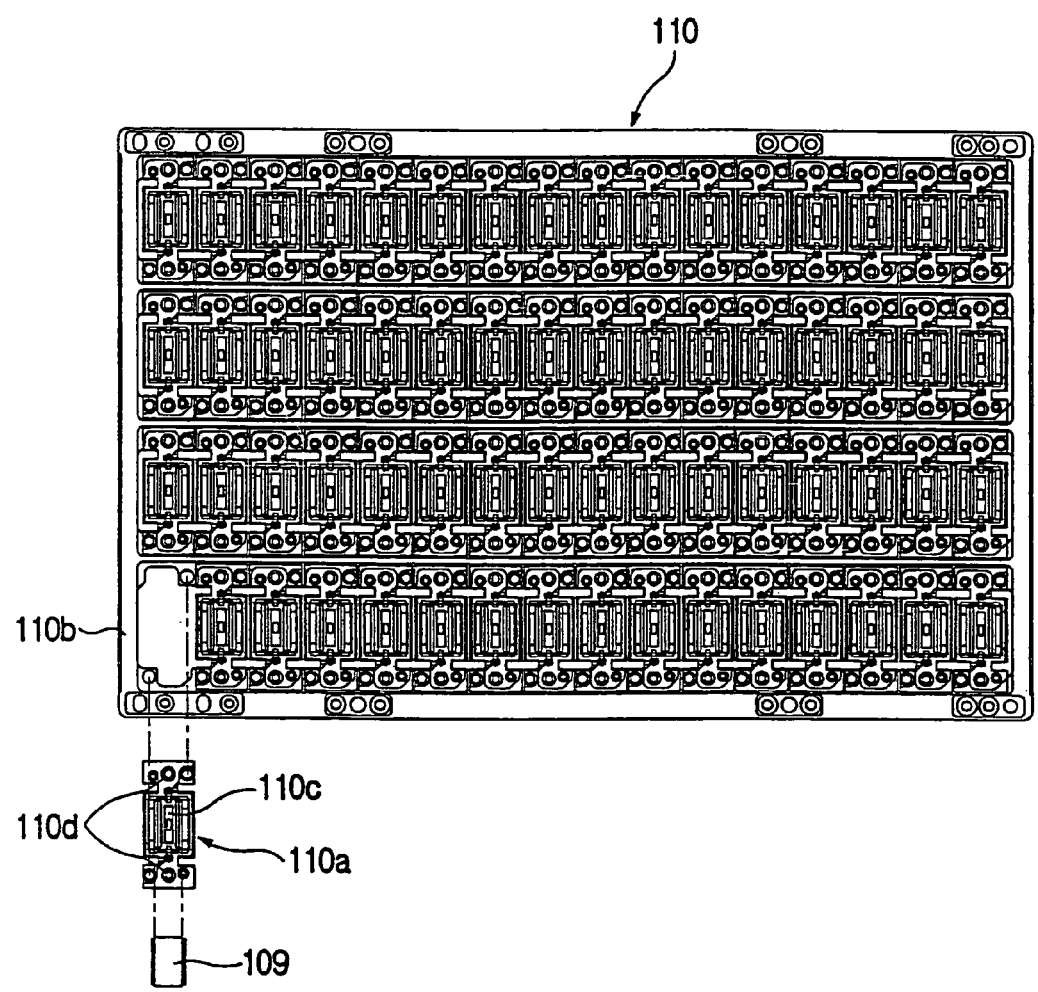
FIG. 3 is a plan view showing the construction of a test tray that is loaded with the devices by the conventional device loading apparatus.
Figure 4:
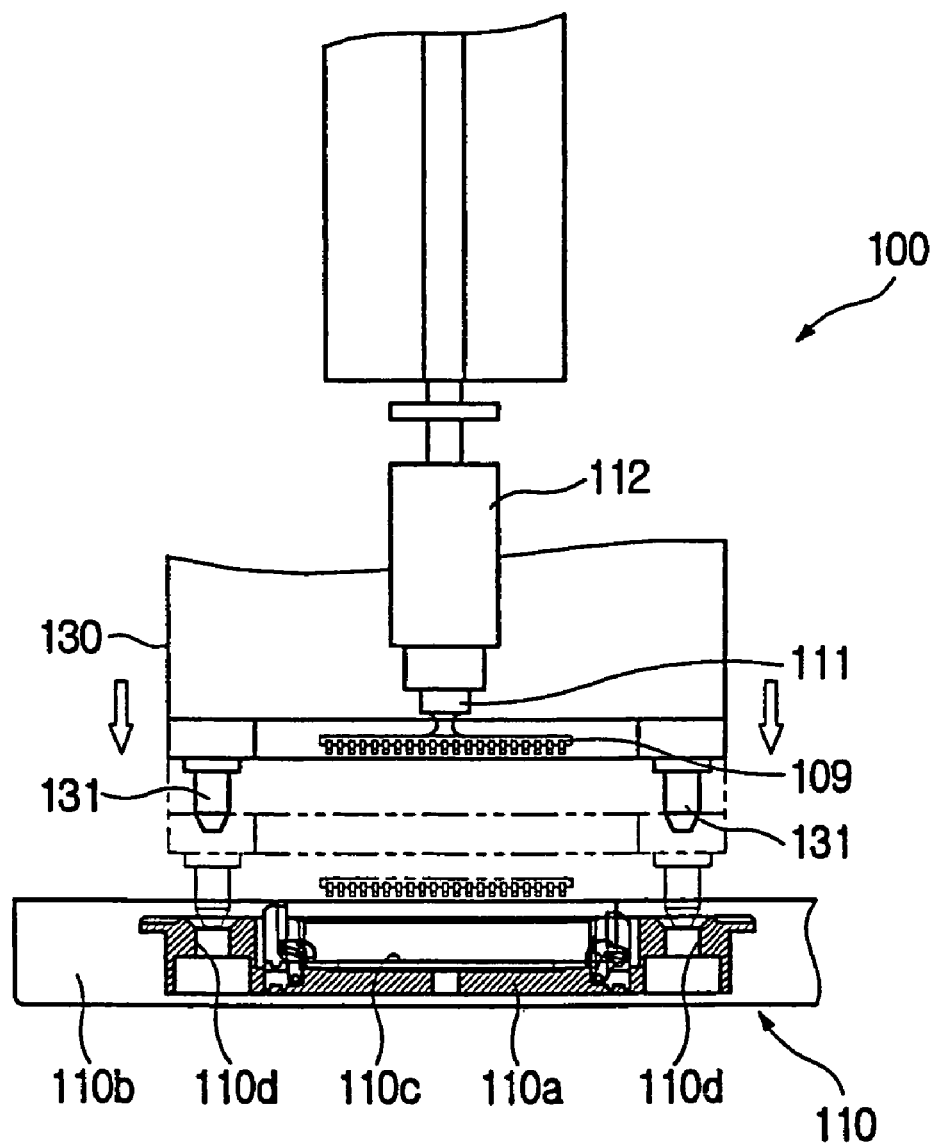
FIG. 4 is a partial cross section showing the operation in which devices are loaded in the test tray by the conventional device loading apparatus.

As depicted in the drawings, the device loading apparatus 50 of the present invention is a robot that is movable in an X-axis direction along a ball screw so as to have an operating range from a presizing unit (not shown) to a device unloading unit (not shown). The device loading apparatus includes a pair of frames 52 arranged one in front of the other, sixteen pickup cylinders 54 with sixteen vacuum adsorbers 53 arranged side by side inside of each frame 52 to be slidably movable to the right and left along two guide rods 52a, a space adjusting plate 55 for adjusting the pitches of the vacuum adsorbers 53, an elevation guiding means 56 constructed in the form of a linear motion guide to guide the lifting and lowering of the space adjusting plate 55, a body 60 provided with a pneumatic cylinder 57 for operating the space adjusting plate 55, and a guide block fixing plate 70 separated from the apparatus body 60 and guiding devices to be accurately transferred to the pockets 110a (see FIG. 3) of the test tray 110, respectively.

The space adjusting plate 55 functions to simultaneously adjust all the pitches of the vacuum adsorbers 53. A plurality of guide slots 55a are slantingly formed through the space adjusting plate 55 to receive a plurality of guide projections 53a protruded from the upper portions of the vacuum adsorbers 53. As shown in FIG. 6, when the space adjusting plate 55 is lifted (in the arrow "A" direction of FIG. 6) by the operation of the pneumatic cylinder 57, the pitches of the vacuum adsorbers 53 are narrowed to correspond to the spaces between the devices positioned in the presizing unit 30. In contrast, as shown in FIG. 7, the space adjusting plate 55 is lowered (in the arrow "B" direction of FIG. 6) by the operation of the pneumatic cylinder 57, the pitches of the vacuum adsorbers 53 are widened to correspond to the spaces between the pockets 110a of the test tray 110.

The guide block fixing plate 70 of the device loading apparatus is positioned to be spaced apart from the vacuum adsorbers 53 and to be brought over the test tray 110. The guide block fixing plate 70 is integrally provided with guide blocks 71 of a number corresponding to the number of the pockets 110a of the test tray 110.

Preferably, the guide block fixing plate 70 is situated at the position under the apparatus body 60 of the device loading apparatus 50 to be moved to the front, rear, right and left, so the device loading apparatus can carry out its pick-and-place operation effectively.

Figure 8A:
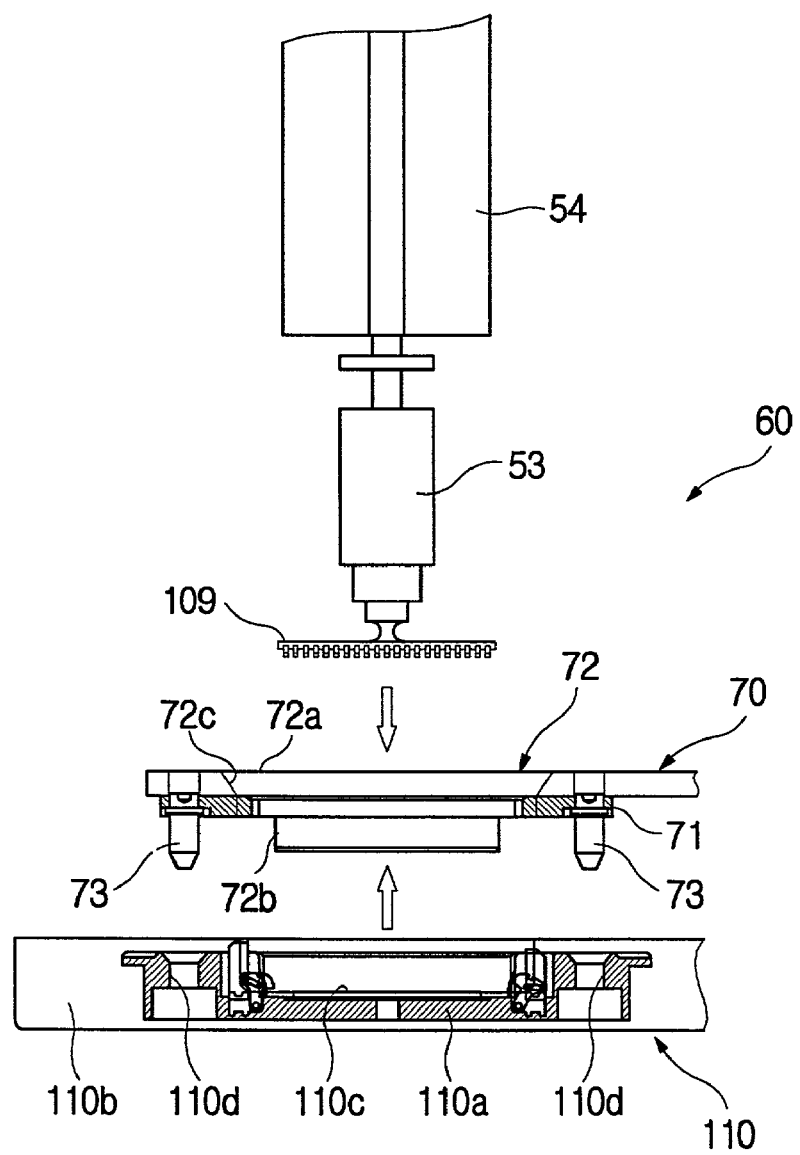
Figure 8B:
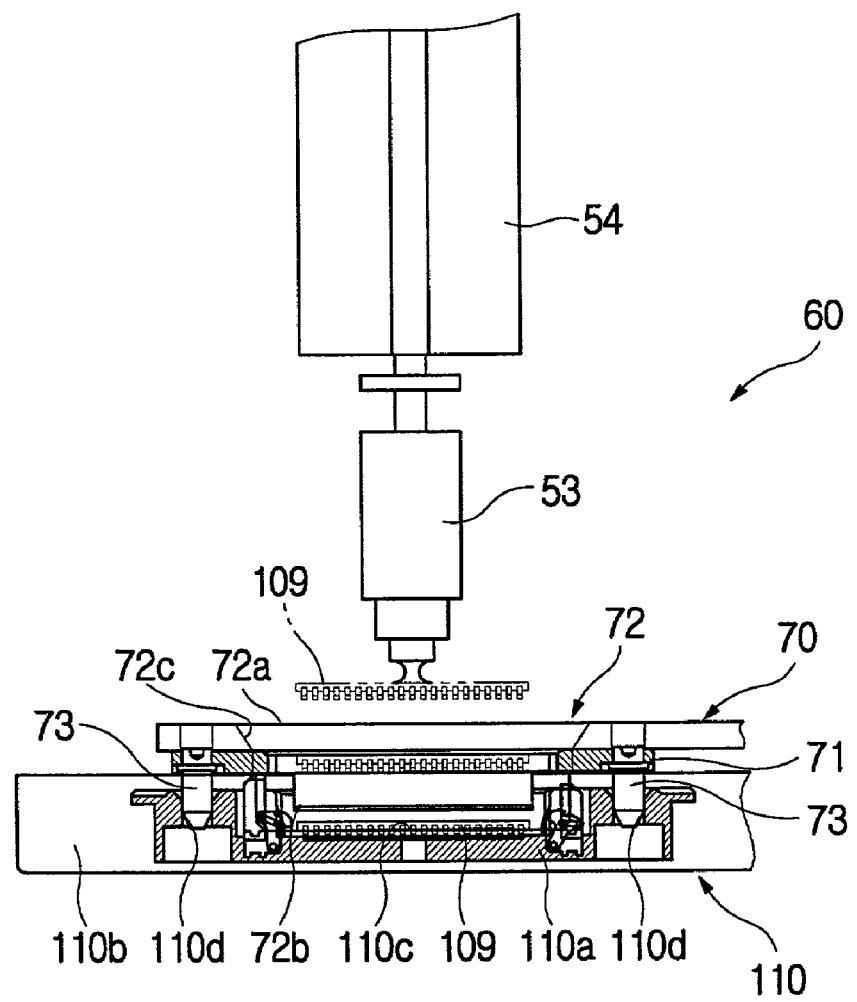

As illustrated in FIGS. 8A and 8B, each of the guide blocks 71 has an opening 72 sized to coincide with the size of the device 109. A pair of guide pins 73 are downwardly formed on the front and rear edges of the guide block 71. The diameter of each of the guide pins 73 is smaller than the diameter of each of the pin holes 110d formed in the front and rear edges of the pocket 110a, and the space between the pair of guide pins 73 is equal to the space between the pair of pin holes 110d, so the operation of inserting the guide pins 73 into the pin holes 110d and removing the guide pins 73 from the pin holes 110d can be carried out smoothly.

The opening 72 of the guide block 71 consists of an entrance portion 72a formed on the upper surface of the guide block 71 and sized to be slightly larger than the size of the device 109 to easily receive the device, an exit portion 72b formed on the lower surface of the guide block 71 and sized to be substantially equal to the size of the device to allow the device to pass therethrough, and a guide portion 72c formed between the entrance and exit portions 72a and 72b and tapered from the entrance portion 72a to the exit portion 72b. Additionally, the size of the exit portion 72b through which the device is finally removed from the guide block 71 is designed to be equal to the size of the device seat 110c of the pocket 110a where the device 109 is laid down on the test tray 110.

Next, with reference to FIGS. 8A and 8B, the operation of the device loading apparatus of the present invention is described.

FIGS. 8A and 8B are partial cross sections showing the operation of the device loading apparatus, wherein FIG. 8A is a view showing the operation in which the pickup cylinder and the test tray are being moved toward the guide block fixing plate to load the device in the test tray, and FIG. 8B is a view showing the operation in which the device adhered to the pickup cylinder is transferred to the test tray after the test tray and the guide block fixing plate are joined together.

First of all, referring to FIG. 8A, the apparatus body 60 of the device loading apparatus 50 vacuum-sucks the devices 109 loaded in the presizing unit, and is moved to a position over the test tray 110 and the guide block fixing plate 70. Thereafter, the apparatus body 60 of the device loading apparatus 50 is downwardly moved to easily drop the devices into the openings 72 of the guide blocks 71, so the vacuum adsorbers 53 to which the devices are adhered are positioned near the guide block fixing plate 70. At the same time, the test tray 110 positioned under the guide block fixing plate 70 is upwardly moved, so the guide pins 73 formed on the guide blocks 71 are inserted to the corresponding pin holes 110d of the test tray 110, thereby joining the test tray and the guide block fixing plate 70 together as shown in FIG. 8B.

As shown in FIG. 8B, when sucking force is removed from the vacuum adsorbers 53 attached to the lower portions of the pickup cylinders 54, the devices adhered to the vacuum adsorbers 53 fall to the guide blocks 71 of the guide block fixing plate 70. The devices having fallen to the guide blocks 71 pass through the openings 72 of the guide blocks 71, which is described in detail hereinafter.

First of all, the devices 109 easily enter the entrance portions 72a of the openings 72 each sized to be slightly larger than the size of each device 109. Subsequently, the devices 109 are arranged to coincide with the device seats 110c formed in the pockets 110a of the test tray 110 while being moved along the guide portions 72c of the openings 72. After the devices 109 pass through the exit portions 72b of the openings 72 each sized to allow each device to be removed, the devices 109 are accurately positioned on the device seats 110c of the pockets 110a of the test tray 110.

After accurately positioning the devices 109 in the pockets 110a of the test tray 110, the device loading apparatus 50 is moved to pick up the devices from the presizing unit 30 or to remove tested devices to the device unloading unit 7.

As described above in detail, in the device loading apparatus for test handlers in accordance with the present invention, the guide block fixing plate is designed to be separate from the apparatus body, so there is produced the effect that the apparatus body can be rapidly and accurately moved to desired locations.

In addition, in the device loading apparatus of the present invention, the openings are formed through the guide blocks of the guide block fixing plate. Each of the openings is comprised of the entrance portion sized to be slightly larger than the size of the device, the exit portion sized to be substantially equal to the size of the device so as to allow the device to pass therethrough, and the guide portion tapered from the entrance portion to the exit portion. Therefore, the devices can be accurately positioned in the pockets of the test tray, thereby producing the effect of reducing error and defective rates.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device loading apparatus for test handlers, comprising:

a body including a plurality of pickup cylinders provided with a plurality of vacuum adsorbers to vacuum-suck and to transfer semiconductor devices to be tested, a space adjusting plate to adjust pitches of the vacuum adsorbers, and an elevation guiding unit to guide one of lifting and lowering of the space adjusting plate, wherein said space adjusting plate is provided with a plurality of differently slanted guides formed to individually adjust the pitches of the vacuum adsorbers, with said vacuum adsorbers each interacting with a respective one of the differently slanted guides; and a guide block fixing plate, separate from the body, to guide the semiconductor devices to be accurately positioned in pockets of a test tray, respectively.

2. A semiconductor device loading apparatus for test handlers, comprising:

a body including a plurality of pickup cylinders provided with a plurality of vacuum adsorbers to vacuum-suck and to transfer semiconductor devices to be tested, a space adjusting plate to adjust pitches of the vacuum adsorbers, and an elevation guiding unit to guide one of lifting and lowering of the space adjusting plate; and a guide block fixing plate, separate from the body, to guide the semiconductor devices to be accurately positioned in pockets of a test tray, respectively, wherein said space adjusting plate is provided with a plurality of differently slanted guide slots formed to allow spaces therebetween to be downwardly narrowed so as to adjust the pitches of the vacuum adsorbers, and said vacuum adsorbers are each provided with a guide projection adapted to insert to a respective one of the guide slots.

3. A semiconductor device loading apparatus for test handlers, comprising:

a body including a plurality of pickup cylinders provided with a plurality of vacuum adsorbers to vacuum-suck and to transfer semiconductor devices to be tested, a space adjusting plate to adjust pitches of the vacuum adsorbers, and an elevation guiding unit to guide one of lifting and lowering of the space adjusting plate; and a guide block fixing plate, separate from the body, to guide the semiconductor devices to be accurately positioned in pockets of a test tray, respectively, wherein said guide block fixing plate is positioned to be downwardly spaced apart from the vacuum adsorbers and upwardly spaced apart from the test tray, and is provided with guide blocks of a number equal to a number of the pockets of the test tray.

4. The semiconductor device loading apparatus according to claim 3, wherein said guide blocks are each provided with an opening sized to be equal to a size of each of the semiconductor devices, and with a pair of guide pins downwardly extending from front and rear edges thereof.

5. The semiconductor device loading apparatus according to claim 4, wherein:

each of the pockets includes a pair of pin holes formed in front and rear edges thereof; and each of said guide pins have a diameter smaller than a diameter of a respective one of the pin holes, and said guide pins are spaced apart from each other by a space equal to a space between the pair of pin holes.

6. The semiconductor device loading apparatus according to claim 4, wherein each said opening comprises an entrance portion formed on an upper surface of the guide block and sized to be slightly larger than a size of a respective semiconductor device to receive the respective semiconductor device, an exit portion formed on a lower surface of the guide block and sized to be substantially equal to the size of the respective semiconductor device to allow the respective semiconductor device to pass therethrough, and a guide portion formed between the entrance and exit portions and tapered from the entrance portion to the exit portion.

7. A semiconductor device loading apparatus, comprising:

a plurality of device loading units to load semiconductor devices;

a space adjusting unit provided with a plurality of differently slanted guides formed to individually adjust pitches of the device loading units; and an elevation control unit coupled to the space adjusting unit and controlling an elevation of the space adjusting unit to change a spacing between respective adjacent device loading units in accordance with the elevation of the space adjusting unit by causing the respective adjacent device loading units to interact with a respective one of the differently slanted guides.

8. The semiconductor device loading apparatus according to claim 7, further comprising:

a guide block fixing unit provided adjacent to the plurality of device loading units to guide the semiconductor devices therethrough to pockets of a test tray, respectively.

9. The semiconductor device loading apparatus according to claim 7, wherein said space adjusting unit comprises:

a plurality of space changing units, including the plurality of differently slanted guides, corresponding to the plurality of device loading units to change each respective spacing between adjacent device loading units.

10. The semiconductor device loading apparatus according to claim 7, wherein each respective spacing between adjacent device loading units is narrowed, when the elevation of the space adjusting unit is increased.

11. The semiconductor device loading apparatus according to claim 7, wherein each respective spacing between adjacent device loading units is widened, when the elevation of the space adjusting unit is decreased.

12. The semiconductor device loading apparatus according to claim 9, wherein each space changing unit comprises:

a guide slot formed on the space adjusting unit, being one of the plurality of differently slanted guides; and a guide projection formed on a respective one of the device loading units to insert into the guide slot corresponding to a respective one of the device loading units to cause the interaction with the respective one of the differently slanted guides.

13. The semiconductor device loading apparatus according to claim 8, wherein the guide block fixing unit is remote from the device loading units and the test tray, and is provided with guide blocks of a number equal to a number of the pockets of the test tray.

14. A semiconductor device loading apparatus, comprising:

a plurality of device loading units to load semiconductor devices;

a space adjusting unit;

an elevation control unit coupled to the space adjusting unit and controlling an elevation of the space adjusting unit to change a spacing between respective adjacent device loading units in accordance with the elevation of the space adjusting unit; and a guide block fixing unit provided adjacent to the plurality of device loading units to guide the semiconductor devices therethrough to pockets of a test tray, respectively, wherein the guide block fixing unit is remote from the device loading units and the test tray, and is provided with guide blocks of a number equal to a number of the pockets of the test tray, and wherein each of the guide blocks is provided with an opening formed therein which is equal in a size thereof to a size of each of the semiconductor devices, and having a pair of guide pins extending toward the test tray from front and rear edges thereof.

15. The semiconductor device loading apparatus according to claim 14, wherein each of the pockets includes a pair of pin holes corresponding to the pair of guide pins such that each of the guide pins have a diameter smaller than a diameter of a corresponding one of the pin holes, and each of guide pins of respective pairs of guide pins are spaced apart from each other by a space equal to a space between a corresponding pair of pin holes.

16. A semiconductor device loading apparatus, comprising:
- a plurality of device loading units to load semiconductor devices;
- a space adjusting unit;
- an elevation control unit coupled to the space adjusting unit and controlling an elevation of the space adjusting unit to change a spacing between respective adjacent device loading units in accordance with the elevation of the space adjusting unit; and
- a guide block fixing unit provided adjacent to the plurality of device loading units to guide the semiconductor devices therethrough to pockets of a test tray, respectively,
- wherein the guide block fixing unit is remote from the device loading units and the test tray, and is provided with guide blocks of a number equal to a number of the pockets of the test tray, and
- wherein each of the guide blocks comprises an open portion having an entrance portion formed on one surface of the guide block and an exit portion formed on another surface of the guide block such that the entrance portion is larger in a size thereof than a size of the exit portion and a respective semiconductor device is substantially equal in a size thereof to the size of the exit portion to allow the semiconductor device to pass therethrough.

17. The semiconductor device loading apparatus according to claim 8, wherein the plurality of device loading units, the space adjusting unit and the elevation control unit move separately from the guide block fixing unit.

18. A method of loading a semiconductor device with a loading apparatus for test handlers, comprising:
- adjusting pitches of vacuum adsorbers by one of lifting and lowering of a space adjusting plate, wherein said space adjusting plate is provided with a plurality of differently slanted guides formed to individually adjust the pitches of the vacuum adsorbers, with said vacuum adsorbers each interacting with a respective one of the differently slanted guides;
- vacuum-sucking and transferring the semiconductor devices to be tested to the plurality of vacuum adsorbers; and
- guiding the vacuum-sucked and transferred semiconductor devices to be positioned in pockets of a test tray, respectively.

19. A method of loading semiconductor device, comprising:
- changing a spacing between adjacent device loading units in accordance with an elevation of a space adjusting unit, by controlling an elevation thereof, using a plurality of differently slanted guides, of the space adjusting unit, formed to individually adjust the pitches of the vacuum adsorbers, with said vacuum adsorbers each interacting with a respective one of the differently slanted guides; and
- loading the semiconductor devices in accordance with the changed spacing.

20. The method according to claim 19, wherein the loading of the semiconductor devices comprises:
- passing each of the semiconductor devices through a guide block to position the semiconductor devices on a test tray.

21. The method according to claim 19, wherein the changing of the spacing between adjacent device loading units comprises:
- narrowing of the spacing, when the elevation of the space adjusting unit is increased.

22. The method according to claim 19, wherein the changing of the spacing between adjacent device loading units comprises:
- widening of the spacing, when the elevation of the space adjusting unit is decreased.

23. A semiconductor device loading apparatus for test handlers, comprising:
- a body including a plurality of pickup cylinders provided with a plurality of vacuum adsorbers to vacuum-suck and to transfer semiconductor devices to be tested, a space adjusting plate to adjust pitches of the vacuum adsorbers, and an elevation guiding unit to guide one of lifting and lowering of the space adjusting plate such that, when the space adjusting plate is lifted or lowered, the pitches of the vacuum absorbers are adjusted; and
- a guide block fixing plate formed to be separate from the body to guide the semiconductor devices to be accurately positioned in pockets of a test tray, respectively,
- wherein said space adjusting plate is provided with a plurality of differently slanted guides formed to individually adjust the pitches of the vacuum adsorbers, with said vacuum adsorbers each interacting with a respective one of the differently slanted guides.

* * * * *

UNITED STATES PATENT AND TRADEMARK OFFICE
CERTIFICATE OF CORRECTION

PATENT NO. : 7,023,197 B2  
APPLICATION NO. : 09/977199  
DATED : April 4, 2006  
INVENTOR(S) : Byung-Gi Jung It is certified that error appears in the above-identified patent and that said Letters Patent is hereby corrected as shown below:

Column 10, Line 35 change "absorbers" to --adsorbers--.

Signed and Sealed this

Twenty-first Day of November, 2006

JON W. DUDAS  
*Director of the United States Patent and Trademark Office*